(12) United States Patent
Thakur et al.

(10) Patent No.: US 7,745,309 B2
(45) Date of Patent: Jun. 29, 2010

(54) METHODS FOR SURFACE ACTIVATION BY PLASMA IMMERSION ION IMPLANTATION PROCESS UTILIZED IN SILICON-ON-INSULATOR STRUCTURE

(75) Inventors: Randhir P S Thakur, San Jose, CA (US); Stephen Moffatt, Jersey (GB); Per-Ove Hansson, San Jose, CA (US); Steve Ghanayem, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 793 days.

(21) Appl. No.: 11/463,425

(22) Filed: Aug. 9, 2006

(65) Prior Publication Data

US 2008/0038900 A1    Feb. 14, 2008

(51) Int. Cl.
*H01L 21/30* (2006.01)
*H01L 21/46* (2006.01)
(52) U.S. Cl. ............... 438/458; 438/455; 257/E21.568
(58) Field of Classification Search .............. 438/455, 438/458, 462
See application file for complete search history.

(56) References Cited

U.S. PATENT DOCUMENTS 6,536,449 B1    3/2003    Ranft et al.

2004/0166612 A1    8/2004    Maydan et al.
2005/0070073 A1    3/2005    Al-Bayatl et al.
2006/0081558 A1    4/2006    Collins et al.

OTHER PUBLICATIONS

International Search Report and Written Opinion of PCT/US07/75118, dated Jan. 17, 2008.
Lowenstein, et al., "Competitive adsorption of cations onto the silicon surface: The role of the Ammonium ion in Ammonia-peroxide solution", J. Electrochemcial Soc., vol. 146, Issue 10, pp. 3886-3889, abstract, Oct. 1999.
H. Moriceau, et al. "The Bonding Energy Control: An Original Way to Debondable Substrates".

*Primary Examiner*—Alexander G Ghyka
(74) *Attorney, Agent, or Firm*—Patterson & Sheridan

(57) ABSTRACT

Methods for promoting interface bonding energy utilized in SOI technology are provided. In one embodiment, the method for promoting interface bonding energy includes providing a first substrate and a second substrate, wherein the first substrate has a silicon oxide layer formed thereon and a cleavage plane defined therein, performing a dry cleaning process on a surface of the silicon oxide layer and a surface of the second substrate, and bonding the cleaned silicon oxide surface of the first substrate to the cleaned surface of the second substrate.

23 Claims, 5 Drawing Sheets

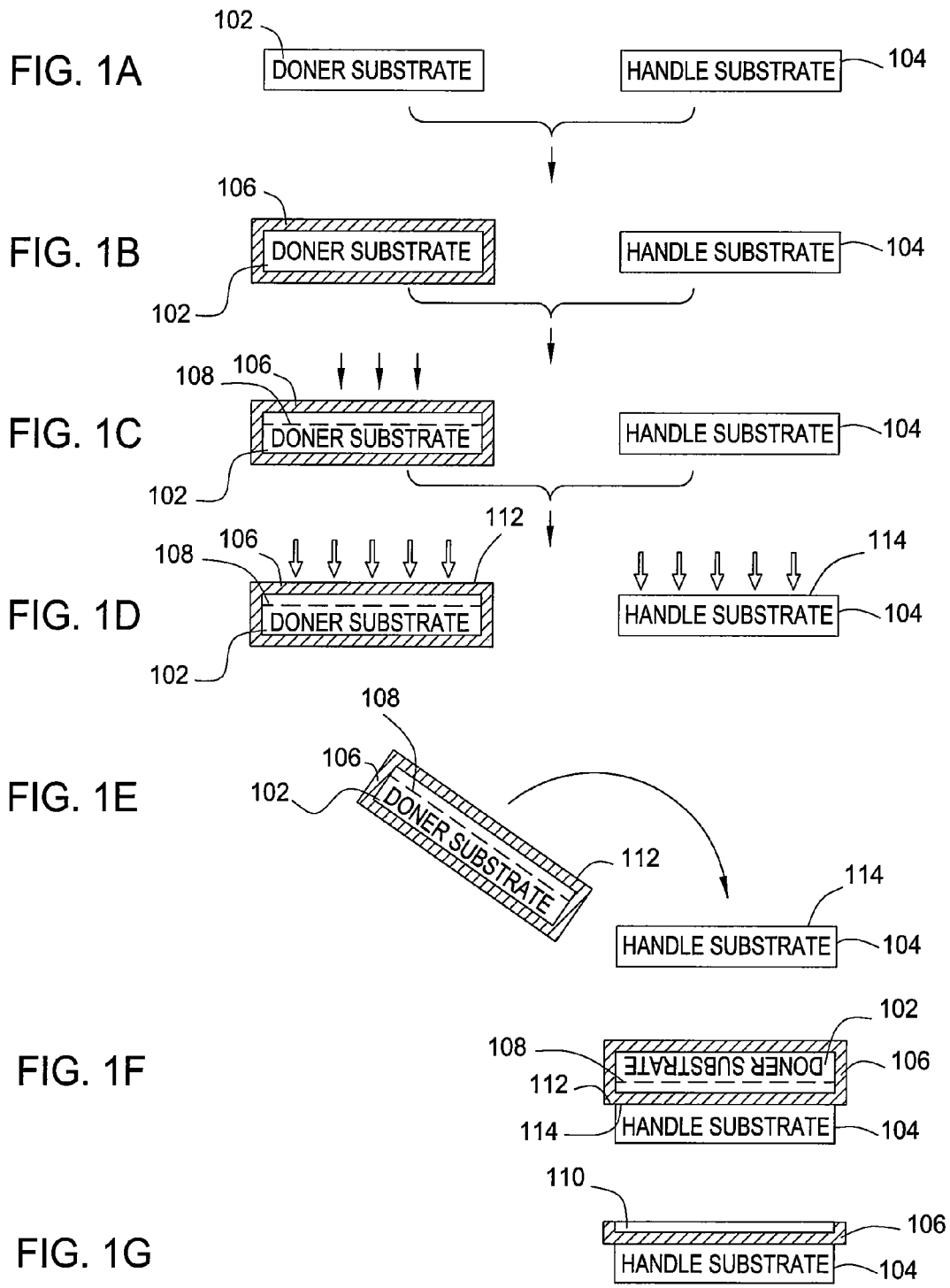

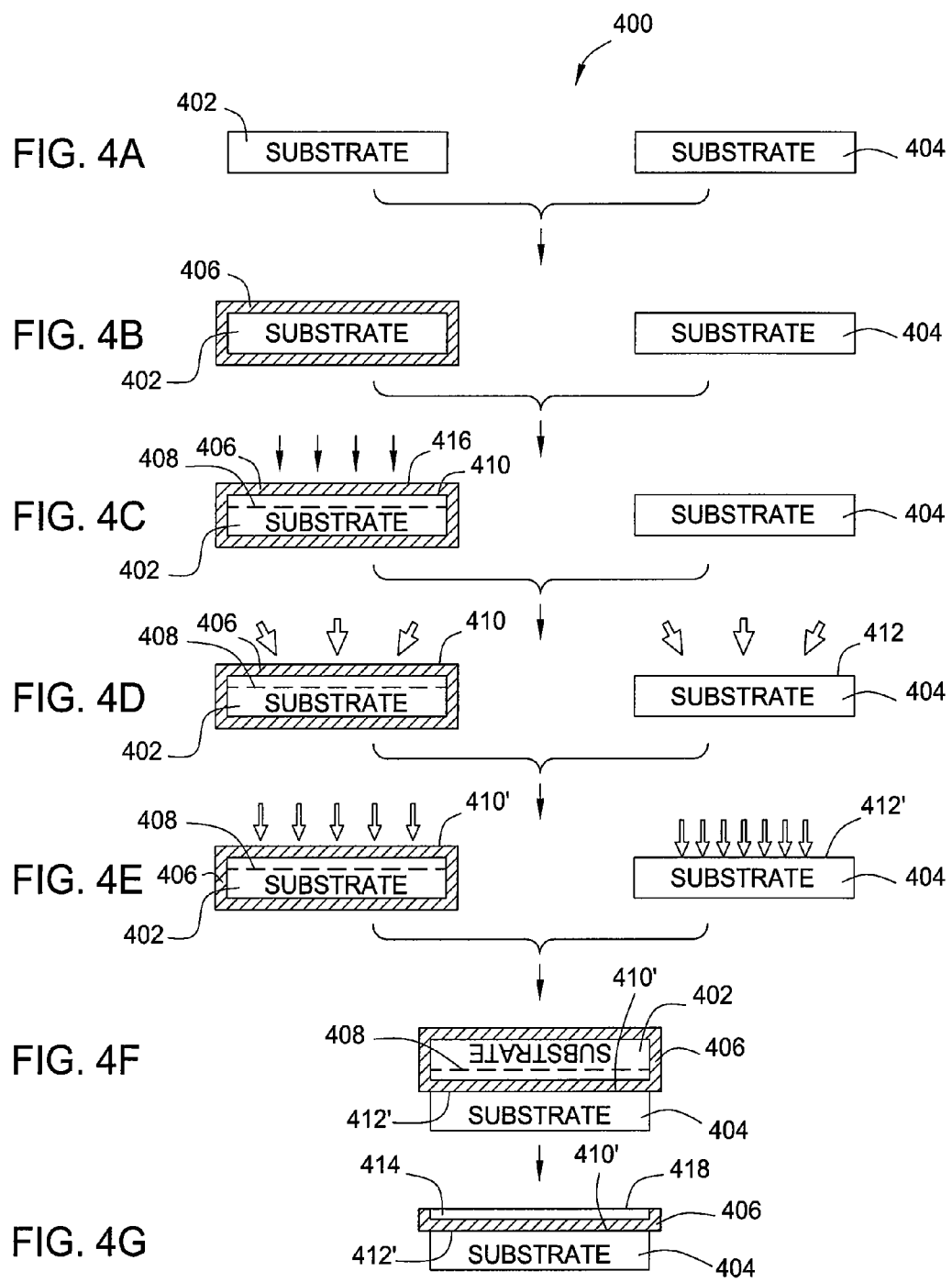

METHODS FOR SURFACE ACTIVATION BY PLASMA IMMERSION ION IMPLANTATION PROCESS UTILIZED IN SILICON-ON-INSULATOR STRUCTURE

BACKGROUND OF THE INVENTION

1. Field of the Invention

Embodiments of the invention generally relate to the field of semiconductor manufacturing processes and devices, more particular, to methods of surface activation by plasma immersion ion implantation process utilized in silicon-on-insulator (SOI) structure.

2. Description of the Related Art

Semiconductor circuit fabrication is evolving to meet ever increasing demands for higher switching speeds and lower power consumption. A higher device switching speed at a given power level is desired for applications requiring large computational power. In contrast, a lower power consumption level at a given switching speed is desired for mobile applications. Increased device switching speed may be attained by reducing the junction capacitance. Reduced power consumption may be attained by reducing parasitic leakage current from each device to the substrate. Both reduced junction capacitance and reduced parasitic leakage current is attained by forming devices on multiple silicon islands formed on an insulating (e.g., silicon oxide) layer on the semiconductor substrate. Each island is electrically insulated from all other islands by the insulating layer. Such a structure is called a silicon-on-insulator (SOI) structure.

SOI structures may be formed in a layer transfer process in which a crystalline silicon wafer is bonded to the top of a silicon oxide layer previously formed on another crystalline silicon wafer. FIGS. 1A-G depict an exemplary conventional method for fabricating SOI structures on a substrate. A donor substrate 102 and a handle substrate 104 are utilized to form SOI structures, as shown in FIG. 1A. A thermal oxidation process may be performed to form a silicon oxide layer 106 on the surface and/or the periphery of the donor substrate 102, as shown in FIG. 1B. An ion implantation process may be performed to implant ions, e.g., hydrogen ions, into the donor substrate 102, thereby forming a cleavage plane 108 at a predetermined depth below the surface of the donor substrate 102, as shown in FIG. 1C. Subsequently, an $O_2$ plasma surface treatment process may be performed to form activated surfaces 112, 114 on both the donor substrate 102 and handle substrate 104, as shown in FIG. 1D, promote the bonding energy at the interface. The activated surfaces 112, 114 are abutted together by flipping the silicon oxide surface the donor substrate 102 over to adhere to the surface 114 of the handle substrate 104, as shown in FIG. 1E. The activated surface 112 of the donor substrate 102 is therefore bonded to the activated surface 114 on the handle substrate 104, as shown in FIG. 1F. In a final step, the donor substrate 102 is split along the cleavage plane 108, leaving a portion of silicon layer 110 and the silicon oxide layer 106 adhered to the handle substrate 104, as shown in FIG. 1G. The silicon layer 110 and the silicon oxide layer 106 bonded on the handle substrate 104 form the SOI structure.

During substrate bonding process, several problems have been observed. For example, interface surface particles, surface imperfections, contaminants, or air trapped at the substrate interface may result in poor adhesion and bonding failure between the donor and handle substrates. Poor adhesion and bonding failure at the interface may affect the mechanical strength and electric behavior of the devices built on the substrate, thereby causing poor device performance and/or failure, along with adversely affecting device integration.

Therefore, there is a need to improve bonding of substrates in SOI fabrication.

SUMMARY OF THE INVENTION

Methods for promoting interface bonding between substrates are provided. The methods are particularly useful for SOI fabrication. In one embodiment, a method for promoting interface bonding energy includes providing a first substrate and a second substrate, wherein the first substrate has a silicon oxide layer formed thereon and a cleavage plane defined therein, performing a dry cleaning process on a surface of the silicon oxide layer and a surface of the second substrate, and bonding the cleaned silicon oxide surface of the first substrate to the cleaned surface of the second substrate.

In another embodiment, a method for promoting interface bonding energy includes providing a first substrate and a second substrate, wherein the first substrate has a silicon oxide layer formed thereon and a cleavage plane defined therein, removing particles and/or contaminants from the surface of the first and the second substrate by a dry cleaning process, activating the surface of the first and the second substrates, and bonding the silicon oxide layer to the surface of the second substrate.

In yet another embodiment, a method for promoting interface bonding energy includes providing a first substrate and a second substrate, wherein the first substrate has a silicon oxide layer formed thereon and a cleavage plane defined therein, dry cleaning a surface of the silicon oxide layer and a surface of the second substrate in the present of a halogen containing gas in a plasma immersion ion implantation reactor, activating the cleaned surfaces of the first and the second substrates, and bonding the silicon oxide surface to the activated surface of the second substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1G depict an exemplary embodiment of a conventional process for SOI structures manufacture;

FIGS. 4A-4G depict cross section views of SOI structures formed on a substrate according to the method as described in FIG. 3.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for promoting interface bonding energy between substrates that may be utilized in SOI fabrication. In one embodiment, an improved interface bonding is obtained by exposing the substrates to halogen containing gases or inert gases in a plasma immersion ion implantation process to modify the interface surface properties prior to bonding the substrates. This process removes the surface contaminants and/or particles, thereby providing a clean interface that promotes the bonding process. This process also activates the substrate surface, modifying the surface properties in a manner that increases the chemical strength for substrate bonding. Furthermore, this process provides efficient control of energies utilized to modify the interface properties at and just below the substrate surface, thereby resulting in better process control and surface modification.

Figure 2A:
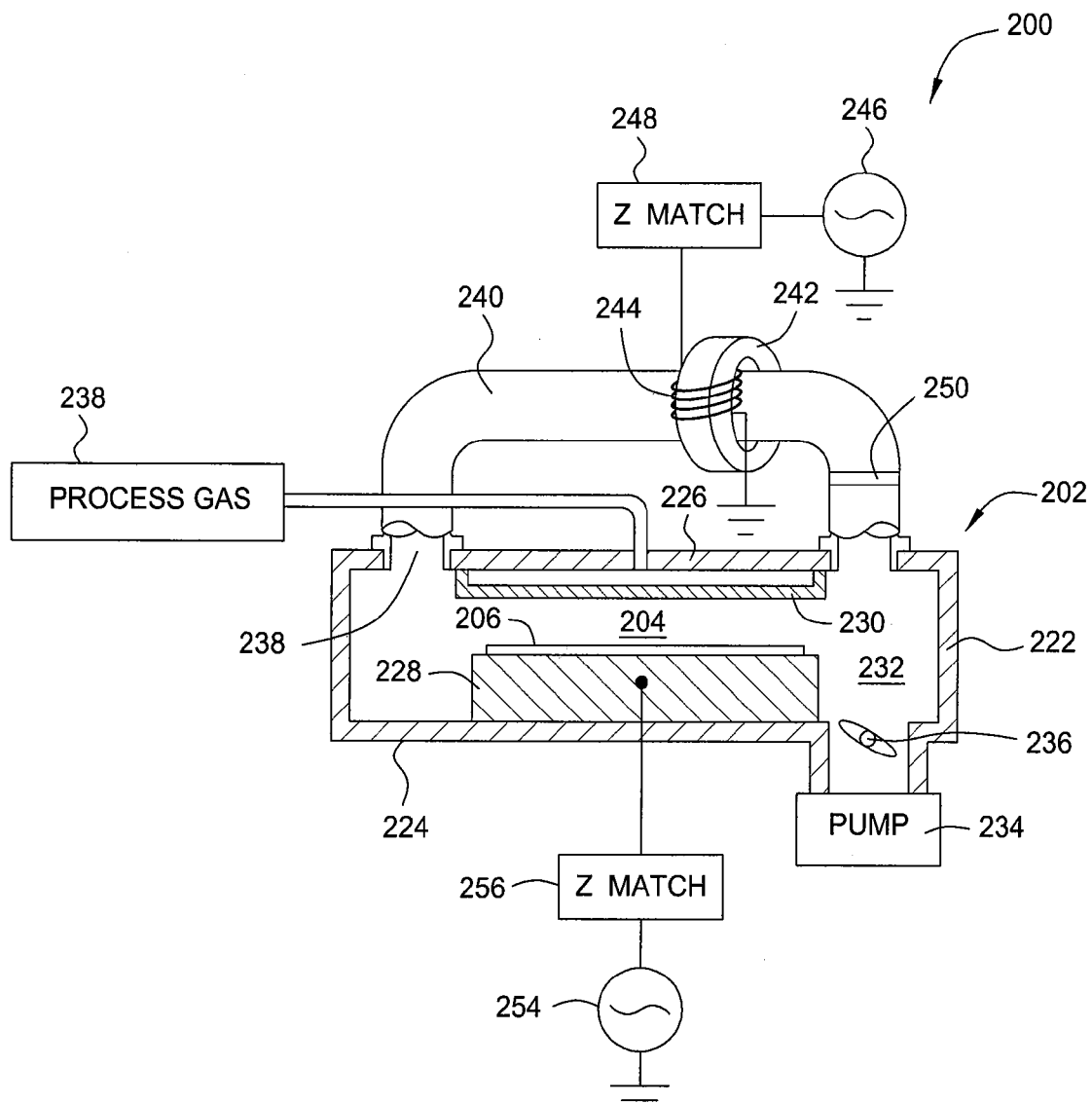
FIGS. 2A-B depict one embodiment of a plasma immersion ion implantation tool suitable for practice the present invention.

FIG. 2A depicts a plasma reactor 200 that may be utilized to practice the bonding process according to one embodiment of the invention. Suitable reactors for bonding process include P3i® reactors, available from Applied Materials, Inc., of Santa Clara, Calif. It is contemplated that the methods described herein may be practiced in other suitable plasma reactors, including those from other manufacturers.

The plasma reactor 200 includes a chamber body 202 having a bottom 224, a top 226, and side walls 222 defining a process region 204. A substrate support assembly 228 is disposed in the bottom 224 of the chamber body 202 and is adapted to receive a substrate 206 for processing. A gas distribution plate 230 is coupled to the top 226 of the chamber body 202 facing the substrate support assembly 228, thereby defining the process region 204 therebetween. A pumping port 232 is defined in the chamber body 302 and coupled to a vacuum pump 234. The vacuum pump 234 is coupled through a throttle valve 236 to the pumping port 232. A gas source 238 is coupled to the gas distribution plate 230 to supply gaseous precursor compounds of the species for processes performed on the substrate 204.

Figure 2B:
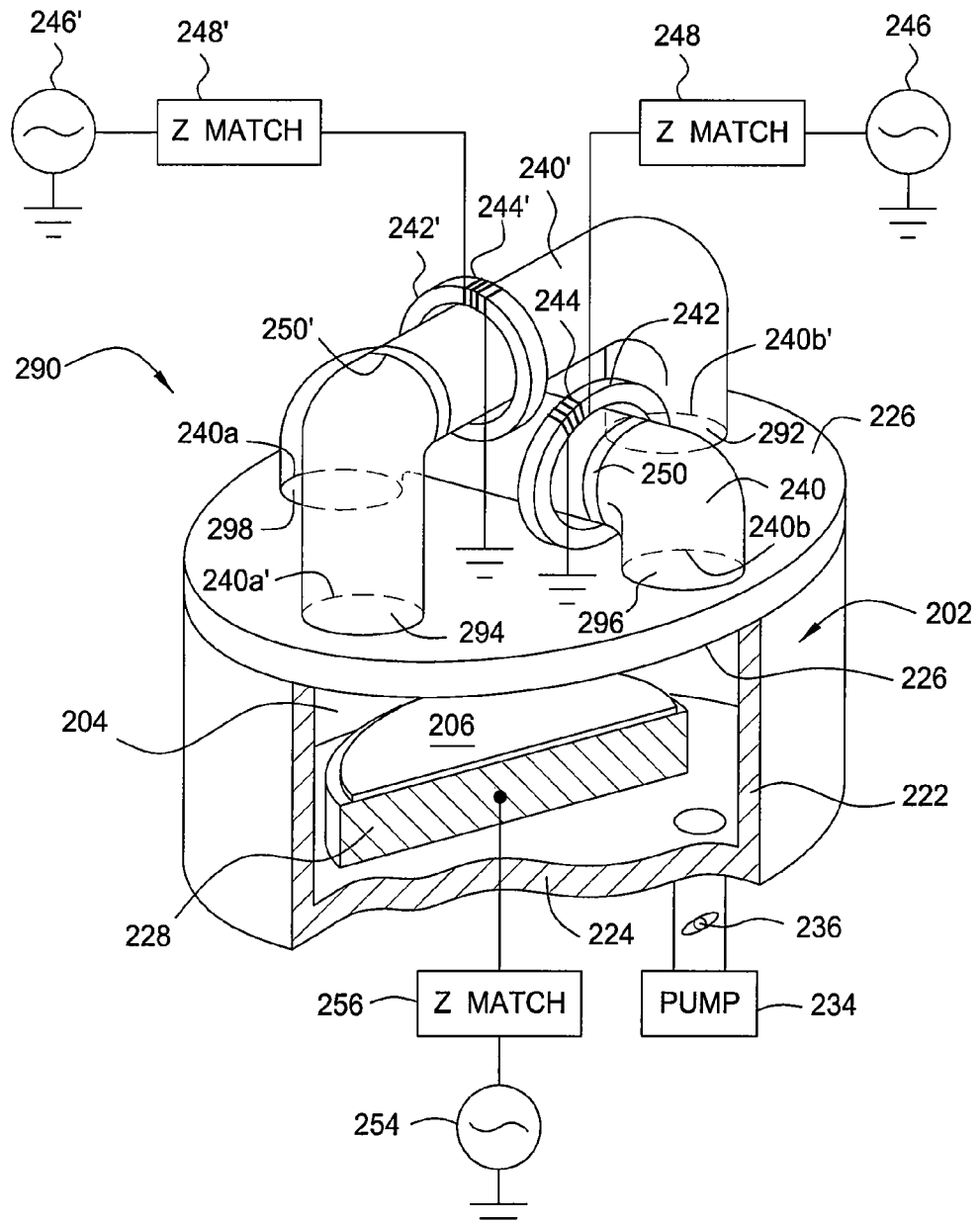

The reactor 200 depicted in FIG. 2A further includes a plasma source 290 best shown in the perspective view of FIG. 2B. The plasma source 290 includes a pair of separate external reentrant conduits 240, 240' mounted on the outside of the top 226 of the chamber body 202 disposed transverse to one another (or orthogonal to one another as the exemplary embodiment depicted in FIG. 2B). The first external conduit 240 has a first end 240a coupled through an opening 298 formed in the top 226 into a first side of the process region 204 in the chamber body 202. A second end 240b has an opening 296 coupled into a second side of the process region 204. The second external reentrant conduits 240' has a first end 240a' having an opening 294 coupled into a third side of the process region 204 and a second end 240b' having an opening 292 into a fourth side of the process region 204. In one embodiment, the first and second external reentrant conduits 240, 240' are configured to be orthogonal to one another, thereby providing the two ends 240a, 240a', 240b. 240b' of each external reentrant conduits 240, 240' disposed at 90 degree intervals around the periphery of the top 226 of the chamber body 202. The orthogonal configuration of the external reentrant conduits 240, 240' allows a plasma source distributed uniformly across the process region 204. It is contemplated that the first and second external reentrant conduits 240, 240' may be configured as other distributions utilized to provide uniform plasma source into the process region 204.

Magnetically permeable torroidal cores 242, 242' surround a portion of a corresponding one of the external reentrant conduit 240, 240'. The conductive coils 244, 244' are coupled to respective RF plasma source power generators 246, 246' through respective impedance match circuits or elements 248, 248'. Each external reentrant conduits 240, 240' is a hollow conductive tube interrupted by an insulating annular ring 250, 250' respectively that interrupts an otherwise continuous electrical path between the two ends 240a, 240b (and 240a', 204b') of the respective external reentrant conduits 240, 240'. Ion energy at the substrate surface is controlled by an RF plasma bias power generator 254 coupled to the substrate support assembly 228 through an impedance match circuit or element 256.

Referring back to FIG. 2A, process gases including gaseous compounds supplied from the process gas source 238 are introduced through the overhead gas distribution plate 230 into the process region 204. RF source plasma power 246 is coupled from the power applicator 242, 244 to gases supplied in the conduit 240, which creates a circulating plasma current in a first closed torroidal path including the external reentrant conduit 240 and the process region 204. Also, RF source power 246' may be coupled from the other power applicator 242', 244' to gases in the second conduit 240', which creates a circulating plasma current in a second closed torroidal path transverse (e.g., orthogonal) to the first torroidal path. The second torroidal path includes the second external reentrant conduit 240' and the process region 204. The plasma currents in each of the paths oscillate (e.g., reverse direction) at the frequencies of the respective RF source power generators 246, 246', which may be the same or slightly offset from one another.

In one embodiment, the power of each plasma source power generators 246, 246' is configured to a level at which their combined effect produces a desired ion flux at the surface of the substrate 206. The power of the RF plasma bias power generator 254 is provided at a level at which the ion energy at the substrate surface corresponded to a desired reacted profile or depth below the top surface of the substrate 206. The combination of the RF plasma source power and RF plasma bias power provide controlled ion energy for plasma treating on the substrate surface, thereby providing a predetermined ion distribution profile and depth on the substrate surface. The controlled ion energy facilitates surface activation and cleaning processes that increase the bonding energy on the to-be-bonded substrate surfaces.

Figure 3:
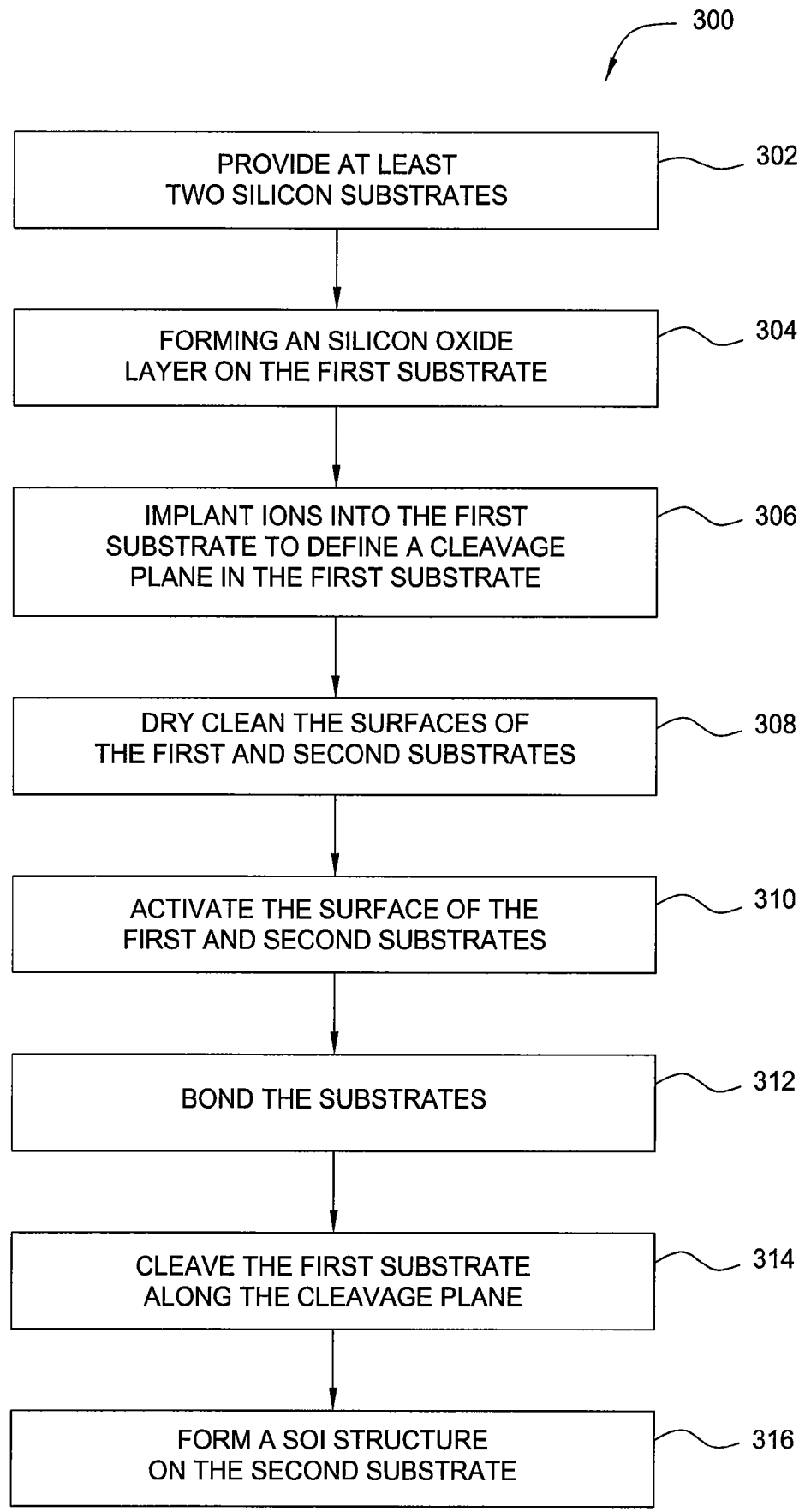
FIG. 3 depicts a process diagram illustrating a method for manufacturing SOI structures according to one embodiment of the present invention.

FIG. 3 depicts a process flow diagram of a method 300 for promoting bonding energies suitable for SOI fabrication. FIGS. 4A-G are schematic cross-sectional views illustrating different stage of a pair of substrates bonding to form SOI structures according to the method 300.

The method 300 begins at step 302 by providing at least two substrates 402, 404 (e.g., a pair) utilized to form SOI structures, as shown in FIG. 4A. In one embodiment, the first substrates 402 and the second substrate 404 may be a material such as crystalline silicon (e.g., Si<100> or Si<111>), strained silicon, silicon germanium, doped or undoped polysilicon, doped or undoped silicon wafers, doped silicon, germanium, gallium arsenide, gallium nitride, glass, and sapphire. The substrates 402, 404 may have various dimensions, such as 200 mm or 300 mm diameter wafers, as well as, rectangular or square panes. Unless otherwise noted, embodiments and examples described herein are conducted on substrates with a 200 mm diameter or a 300 mm diameter.

At step 304, a thermal oxidation process is performed on the first substrate 402 to oxidize the surface and periphery of the first substrate 402, forming a silicon oxide layer 406 thereon. The silicon oxide layer 406 may have a thickness at between about 500 Å and about 5000 Å, such as between about 1000 Å and about 2000 Å.

At step 306, a high energy cleavage ion implantation step is performed in which an ion species, such as hydrogen, is implanted to a uniform depth below the surface 416 to define a cleavage plane 408 within the first substrate 402, as shown in FIG. 4C. Within the cleavage plane 408, the ions implanted at step 306 creates damaged atomic bonds in the silicon crystal lattice, rendering the substrate susceptible to separation along the cleavage plane 108, as will be exploited later in the fabrication sequence described further below. In one embodiment, the cleavage plane 408 may be formed between about 3000 Å and about 5000 Å below the top surface 416 of the silicon oxide layer 406, or between about 1000 Å and about 3000 Å below the surface 410 of the substrate 402. The plasma immersion ion implantation process may be performed in the plasma reactor 200 as described in FIG. 2 or other suitable reactors. The plasma immersion ion implantation process is disclosed in detail by U.S. Patent Publication No. US 2005/0,070,073, published Mar. 31, 2005 to Al-bayati entitled "SILICON-ON-INSULATOR WAFER TRANSTER METHOD USING SURFACE ACTIVATION PLASMA IMMERSION ION IMPLANATION FOR WATER-TO-WAFER ADHESION ENCHANCEMENT" and is herein incorporated by reference.

At step 308, a plasma immersion ion implantation process is utilized to clean and activate the surfaces of the first and second substrates 402, 404, as shown in FIG. 4D. The plasma immersion ion implantation process dry etches the substrate surface, thereby removing the particle and/or surface contaminants on the substrate surface. The plasma immersion ion implantation process is performed at a low ion energy level sufficient to efficiently etch and remove the surface contaminants and/or particles adhered to the surface without adversely penetrating ions deep into the substrate which would damage the formed cleavage plane 408. The ions generated by the plasma immersion ion implantation process of step 308 is controlled and concentrated within about 50 Å of the surfaces 410, 412 of the substrates 402, 404. The peak of the ion distribution is maintained close to the surface with little or no fall-off in the distribution between the distribution peak and the surface. Moreover, a graded change in the depth distribution downward from the substrate surface is desired to control the ions distributed within the top 50 Å. The plasma immersion ion implantation may be performed at the plasma reactor 200 as described at FIG. 2A-B or other suitable reactor.

In one embodiment, the dry clean and particle removal process performed at step 308 includes exposing the substrates to a halogen containing gas in the plasma reactor while maintaining the ion energy at a low level. Suitable examples of suitable halogen containing gas include $Cl_2$, $F_2$, $Br_2$, HCl, HBr, $SF_6$, $NF_3$ or the like. A low RF bias power voltage of less than about 500 Volts (V) may be applied ions formed from the halogen containing gas to bombard the substrates with low energies. The halogen ions etch and remove the surface contaminants, thereby providing a clean surface that promotes surface bonding. In one embodiment, the halogen containing gas may be flowed into the plasma reactor at a rate of between about 100 sccm and about 5000 sccm. The source RF power may be maintained at between about 50 Watts and about 2000 Watts at a RF voltage between about 0 Volts and about 500 Volts. The bias RF power may be maintained at between about 50 Watts and about 1000 Watts at a RF voltage between about 0 Volts and about 500 Volt, such as between about 50 Volts and about 250 Volts, for example, less than 200 Volts. The reactor pressure may be maintained at between about 5 mTorr and about 500 mTorr. The substrate temperature may be maintained at between about 100 degrees Celsius and about 1000 degrees Celsius, such as between about 450 degrees Celsius and about 750 degrees Celsius, for example about 600 degrees Celsius and about 700 degrees Celsius.

Furthermore, substrate surface may have native oxide, excess water (e.g., moisture) and hydrocarbon contamination from the adjacent environment. The loose texture and structure of native surface oxides may generate impurities and adversely affect quality of the subsequent bonding step. Excess water and hydrocarbon contamination may release hydrogen gas, $CO_2$ gas or other impurities during bonding process, resulting in voids and bubbles trapped in the interface. The halogen ions used for dry cleaning the substrate surface removes the undesired native oxide, water and hydrocarbon contamination from the substrate surface, thereby activating the surface bonding energy for subsequent bonding process.

The etched and/or activated surfaces 410, 412 resulting from the plasma immersion ion implantation process at step 308 enhance the bonding as the etched and/or activated surfaces 410, 412 have a slight surface microroughness and good cleanness. The plasma immersion ion implantation process at step 308 opens lattice sites which makes the lattice sites available to form covalent bonds with lattice sites in the other surface. Also, the etched and/or activated surfaces 410, 412 have slightly rougher surface compared to the unetched surface, providing better occlusion on the contact surfaces to securely adhere to each other, thereby enhancing the bonding energy therebetween.

In another embodiment, the halogen containing gas supplied into the reactor 200 to etch the surface may be supplied with or replaced by an inert gas. Examples of suitable inert gases include Ar, He, Xe, Kr, $N_2$ and the like. The inert gas functions similar to the halogen containing gas. The inert gas in the reactor 200 collides with and removes the particles and/or contaminants from the substrate surface, thereby reducing the impurities from the substrate surfaces and thereby promoting the bonding energy as the substantially similar mechanism stated above.

Alternatively, prior to the surface activation and clean at step 308, a standard clean process may be performed to provide a cleaner surface before processing. The wet clean process may be performed in a clean apparatus, such as a TEMPEST clean tool, available from Applied Materials, Inc. The cleaning solution utilized to clean the substrates may be SC1 and/or SC2 conventional used in the art.

At step 310, an optional surface activation process may be performed, as shown in FIG. 4E. The surface activation process at step 310 is optionally performed as conventional surface activation process available in the art. The surface activation process may be performed to activate the substrate surfaces, forming oxidized layer on the substrate surface. The surface activation process may be performed in the reactor 200 as described in FIGS. 2A-B or other suitable reactor.

The surface activation process includes providing an oxygen gas into the reactor which is ionized by RF power to provide oxygen ions. The oxygen ions oxidize the surfaces of the substrates 402, 404 and convert the silicon oxide layer 410 and silicon layer 412 on the substrates 402, 404 into oxidized silicon layer 410', 412'. The oxidized silicon layer 410', 412' provides a hydrophilic surface promoting the bonding energy between the substrates 404, 404. As the dry clean plasma immersion ion implantation process at step 308 has been performed to promote the surface bonding, the surface activation process at step 310 may be optionally performed.

At step 312, the first substrate 402 is flipped over and bonded to the second substrate 404, as shown in FIG. 4F. Van der Wals forces cause the two surfaces 410' and 412' to adhere. The adhesion between the surfaces 410', 412' may be enhanced by providing a thermal energy, e.g., heating the substrates 402, 404 to a predetermined temperature, during bonding process. In one embodiment, the substrates 402, 404 are heated to predetermined temperature greater than about 800 degrees Celsius. The thermal energy causes the Van der Wals forces to be replaced by atomic bonds formed between facing lattice sites in the oxidized silicon layer surfaces 410', 412'. A greater proportion of the lattice atomic sites in each surface 410', 412' are available for electric bonding with lattice sites in the other surface created by the plasma immersion ion implantation process at step 308. As a result, the bonding force between the substrates 402, 404 is increased over conventional techniques.

At step 314, the first substrate 402 is separated along the cleavage plane 408, leaving a thin portion 414 of the first substrate 402 bonded to the second substrate 404, as shown in FIG. 4G. The thin portion 414 includes a silicon layer disposed on the silicon oxide layer 406 on the silicon substrate 404.

At step 316, the stack film of the silicon layer 414 from the first substrate 404, and the silicon oxide layer 404 on the second substrate 404 is utilized to form SOI substrate.

As the split surface 418 formed on the second surface 404 may becomes rough after cleavage or from the ion bombardment damaged caused at step 306, a surface smoothing implant process may be performed to smooth and recrystallize the surface of the silicon layer 414. The surface smoothing implant process may be achieved by implanting ions at low energy and relatively high momentum, using low energy heavy ions, such as Xe or Ar. The surface smoothing implant process may be performed at the reactor 200 described in FIGS. 2A-B or other suitable reactor. The surface smoothing implant process may be performed by any suitable process.

Although the methods for improving interface bonding energy described in the present application is illustrated for forming SOI, it is contemplated that the methods may be utilized bonding different substrate materials, such as GaN, GeSi, Si, SiO$_2$, InP, GaAs, glass, plastic, metal and the like.

Thus, methods for promoting interface bonding energy are provided. The improved method that advantageously modifies the substrate surface properties and removes the surface contaminants and particles, thereby activating and promoting the bonding force between substrates and facilitating fabrication of robust SOI structures.

While the foregoing is directed to embodiments of the present invention, other and further embodiments of the invention may be devised without departing from the basic scope thereof, and the scope thereof is determined by the claims that follow.

What is claimed:

1. A method for promoting interface bonding energy for forming an silicon on insulator (SOI) structure, comprising:
   providing a first substrate and a second substrate in a plasma immersion ion implantation processing chamber, wherein the first substrate has a silicon oxide layer formed thereon and a cleavage plane defined therein;
   performing a dry cleaning process on the silicon oxide layer of the first substrate in the plasma immersion ion implantation processing chamber and a surface of the second substrate; and
   bonding the cleaned silicon oxide layer to the cleaned surface of the second substrate.

2. The method of claim 1, wherein the step of performing the dry cleaning process further comprises:
   performing a plasma immersion ion implantation process in the plasma immersion ion implantation processing chamber.

3. The method of claim 1, wherein the step of performing the dry cleaning process further comprises:
   exposing the substrates to a halogen containing gas.

4. The method of claim 3, wherein the halogen containing gas comprises at least one of Cl$_2$, F$_2$, Br$_2$, HCl, HBr, SF$_6$, and NF$_3$.

5. The method of claim 1, wherein the step of performing the dry cleaning process further comprises:
   maintaining a RF bias power less than about 500 Volts.

6. The method of claim 1, wherein the step of performing the dry cleaning process further comprises:
   controlling ion penetration during the dry cleaning process at a depth less than 50 Å from the substrate surface.

7. The method of claim 1, wherein the step of performing the dry cleaning process further comprises
   exposing the substrates to an inert gas.

8. The method of claim 7, wherein the inert gas comprises at least one of Ar, He, Kr, Xe and N$_2$.

9. The method of claim 1, wherein the step of performing the dry cleaning process further comprises:
   removing particles and/or contaminants from the surfaces of the first substrate and the second substrate.

10. The method of claim 1, wherein the step of performing the dry cleaning process further comprises:
    activating the surface of the first substrate and the second substrate.

11. The method of claim 1, wherein the step of performing the dry cleaning process further comprises:
    exposing the substrates to an oxygen gas.

12. The method of claim 11, wherein the step of exposing the substrates to an oxygen gas further comprises:
    oxidizing the surfaces of the first substrate and the second substrate; and
    altering the surfaces of the first substrate and the second substrate into hydrophilic state.

13. The method of claim 11, wherein the step of claim 1, wherein the step of bonding the cleaned surface further comprises:
    heating the bonded substrates to a temperature greater than about 800 degrees Celsius.

14. The method of claim 1, further comprising:
    splitting the first substrate along the cleavage plane.

15. The method of claim 1, further comprising:
    forming an silicon on insulator (SOI) structure on the second substrate.

16. A method for promoting interface bonding energy for forming an silicon on insulator (SOI) structure, comprising:
    providing a first substrate and a second substrate in a plasma immersion ion implantation processing chamber, wherein the first substrate has a silicon oxide layer formed thereon and a cleavage plane defined therein;
    removing particles and/or contaminants from surfaces of the first substrate and the second substrate by a dry cleaning process performed in the plasma immersion ion implantation processing chamber;
    activating the cleaned surfaces of the first substrate and the second substrate while removing particles during the dry cleaning process; and
    bonding the silicon oxide layer disposed on the first substrate to the activated surface of the second substrate.

17. The method of claim 16, wherein the step of removing the particles and/or contaminants further comprises:
bombarding the surfaces with ions.

18. The method of claim 17, wherein the step of bombarding further comprises:
generating halogen ions.

19. The method of claim 17, wherein the step of bombarding further comprises:
maintaining a RF bias power less than 500 Volts.

20. The method of claim 17, wherein the step of bombarding further comprises:
controlling ion penetration to a depth less than 50 Å from the surfaces of the first and the second substrate.

21. The method of claim 16, wherein the step of activating the surfaces of the first substrate and the second substrate further comprises:
oxidizing the surfaces of the first substrate and the second substrate.

22. A method for promoting interface bonding energy for forming an silicon on insulator (SOI) structure, comprising:
providing a first substrate and a second substrate, wherein the first substrate has a silicon oxide layer formed thereon and a cleavage plane defined therein;
performing a dry cleaning process on a surface of the silicon oxide layer and a surface of the second substrate by supplying a halogen containing gas in a plasma immersion ion implantation processing chamber;
activating the surfaces of the first substrate and the second substrate while performing the dry cleaning process; and
bonding the silicon oxide surface to the activated surface of the second substrate.

23. The method of claim 22, wherein the halogen containing gas comprises at least one of $Cl_2$, $F_2$, $Br_2$, HCl, HBr, $SF_6$, and $NF_3$.

* * * * *